(12) United States Patent
Prabhakar et al.

(10) Patent No.: US 7,996,752 B2
(45) Date of Patent: Aug. 9, 2011

(54) METHOD AND APPARATUS FOR DECODING A LDPC CODE

(75) Inventors: Abhiram Prabhakar, Pleasonton, CA (US); Yan Zhong, San Jose, CA (US)

(73) Assignee: Legend Silicon Corp., Fremont, CA (US)

( * ) Notice: Subject to any disclaimer, the term of this patent is extended or adjusted under 35 U.S.C. 154(b) by 1130 days.

(21) Appl. No.: 11/744,860

(22) Filed: May 5, 2007

(65) Prior Publication Data
US 2008/0276151 A1    Nov. 6, 2008

(51) Int. Cl.
*G06F 11/00* (2006.01)
(52) U.S. Cl. ...................................................... 714/800
(58) Field of Classification Search .......... 714/800–801, 714/807
See application file for complete search history.

(56) References Cited

U.S. PATENT DOCUMENTS
7,178,080 B2 * 2/2007 Hocevar ........................ 714/752
* cited by examiner

*Primary Examiner* — Shelly A Chase
(74) *Attorney, Agent, or Firm* — Frank F. Tian

(57) ABSTRACT

In a decoder for decoding a low density parity check (LDPC) code suitable for decoding multi-rated LDPC codes, a method is provided. The method comprises the steps of: providing a memory for the decoding with the memory dependent on a parity check matrix H with maximum number of "1"s; using a number of column updating units, updating columns parallely and simultaneously producing messages; and using a number of row updating units, updating rows parallely and simultaneously producing messages. Whereby an improved architecture in a logic and the memory is provided such that an improved throughput, power consumption, and memory area is achieved.

16 Claims, 12 Drawing Sheets

METHOD AND APPARATUS FOR DECODING A LDPC CODE

FIELD OF THE INVENTION

The present invention relates generally to LDPC decoders, more specifically the present invention relates to a LDPC ASIC decoder having improved architecture for throughput, power, memory, and chip area.

BACKGROUND

Data communication systems have been under continual development for many years. Two such communication systems exist; they are a communication system that employs turbo codes and a communication system that employs LDPC (Low Density Parity Check) codes. Each of these different types of communication systems is able to achieve reliable communication with very low BERs (Bit Error Rates). Lowering the required signal to noise ratio for reliable error free communication is of great significance in communication systems. Ideally, the goal is to try to reach Shannon's limit in a communication channel. Shannon's limit can be viewed as the data rate used in a communication channel with a particular SNR (Signal to Noise Ratio) that achieves error free transmission through the communication channel. In other words, the Shannon's limit is the theoretical bound for channel capacity for a given modulation and channel. LDPC code has been shown to provide an excellent decoding performance that can approach the Shannon's limit in some cases. For example, some LDPC codes have been shown to come within 0.0045 dB (decibels) of Shannon's limit for an AWGN (Additive White Gaussian Noise) channel.

LDPC decoders have traditionally been designed for a specific parity check matrix, i.e. H. Thus, the block length that the decoder processes and the rate of the code are fixed for a particular architecture. A need therefore exists for improved LDPC decoders that can support a plurality of code block lengths and code rates. A further need exists for a LDPC decoder that has improved architecture for hardware implementation to achieve higher throughput, lower power consumption, and decreased chip area.

SUMMARY OF THE INVENTION

A LDPC decoder having improved logic architecture is provided.

A LDPC decoder having improved memory structure is provided.

A LDPC decoder having higher throughput is provided.

A LDPC decoder having lower power consumption is provided.

A LDPC decoder having decreased chip area is provided.

A LDPC decoder that can support a plurality of code block lengths and code rates is provided.

In a decoder for decoding a low density parity check (LDPC) code suitable for decoding multi-rated LDPC codes, a method is provided. The method comprises the steps of: providing a memory for the decoding with the memory dependent on a parity check matrix H with a predetermined maximum number of "1"s; using a number of column updating units, updating columns parallely and simultaneously to produce messages; and using a number of row updating units, updating rows parallely and simultaneously producing messages. Whereby an improved architecture in logic and the memory is provided such that an improved throughput, power consumption, and memory area are achieved.

A low density parity check (LDPC) decoder suitable for decoding multi-rated LDPC codes is provided. The decoder comprising: a memory for the decoding with the memory dependent on a parity check matrix H with a predetermined maximum number of "1"s; a number of row updating units, coupled to the memory, for updating rows parallely and simultaneously to produce messages; and a number of row updating units, coupled to the memory, for updating rows parallely and simultaneously producing messages. Whereby an improved architecture in a logic and the memory is provided such that an improved throughput, power consumption, and memory area are achieved.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIGS. 2A-2B is an example of a parity check matrix of the present invention.

Figure 1:
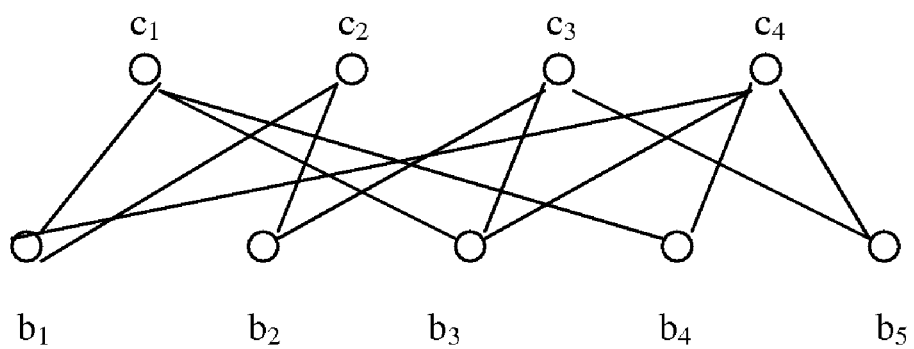
FIG. 1 is an example of a Tanner graph associated with a LDPC decoder with some embodiments of the invention.
Figure 1:
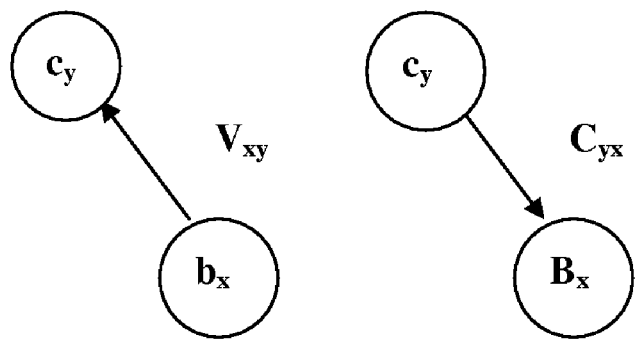

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to a LDPC decoder having improved logic architecture. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Referring to FIG. 1, the parity check matrix of an LDPC code is well represented by a bipartite or tanner graph as shown. Such a graph has two types of nodes namely the variable nodes and check nodes. Each column in the parity check matrix is represented by a variable node and each row in the parity check matrix is represented by a check node. A node is identified by a variable pair (i,j) representing the location of the row/column in the block matrix and its sub-location within the block after expansion. Each "1" in the parity check matrix is represented by a connection between a variable node and a check node corresponding to a column and a row position associated with the "1".

A regular LDPC code is one where all the bit and check nodes have the same degree (i.e. each row or column of a parity check matrix has the same number of "1"s). An irregular LDPC code has bit nodes/check nodes with different degrees. In other words, rows/columns have different numbers of "1"s. A LDPC code is defined by its bit node degree profile and check node degree profile. The degree profile defines how many nodes of a particular degree are there. Given a degree profile, the LDPC code is constructed by randomly connecting the bit nodes with check nodes. Such a random construction is not suitable for a hardware LDPC decoder due to addressing and routing complexities. Recently LDPC parity check matrices that are constructed from sub-blocks of circularly shifted identity matrices and zero matrices have been proposed. An example of such a proposal can be found in a TDS-OFDM system.

Figure 3:
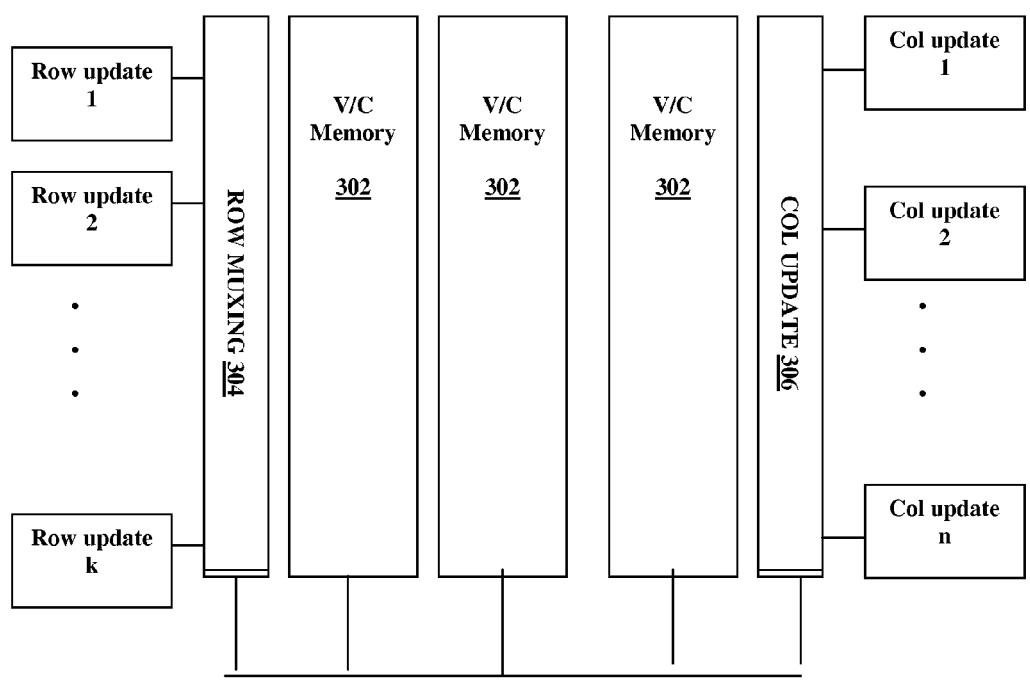
FIG. 3 is an example of a block diagram in accordance with some embodiments of the invention.

For the convenience of notation and explanation, the structure of the parity check matrix is given in FIG. 2A. This matrix of "1"s and "0"s can be conveniently simplified or represented by as block matrix with the blocks represent more than a single element of the parity check matrix. The rows of this block matrix as designated as block rows, and columns of this matrix as block columns. Referring to FIG. 2B, each cyclic shifted matrix in FIG. 2A is represented by an "I" with the shift being represented in the subscript. In this example, the dimensions of the code are kept small for illustration purposes only and do not represent an actual LDPC code. FIG. 3A-3 shows an actual representation of a LDPC parity check matrix where the notation 'I' is dropped out and only the number of shifts is shown.

In communication systems, the LDPC code operates at various code rates, depending on the state of a channel. Therefore, it is preferred that a LDPC decoder architecture should support multi-rated LDPC decoding and not merely supporting a single LDPC code.

Figures 1, 4A:
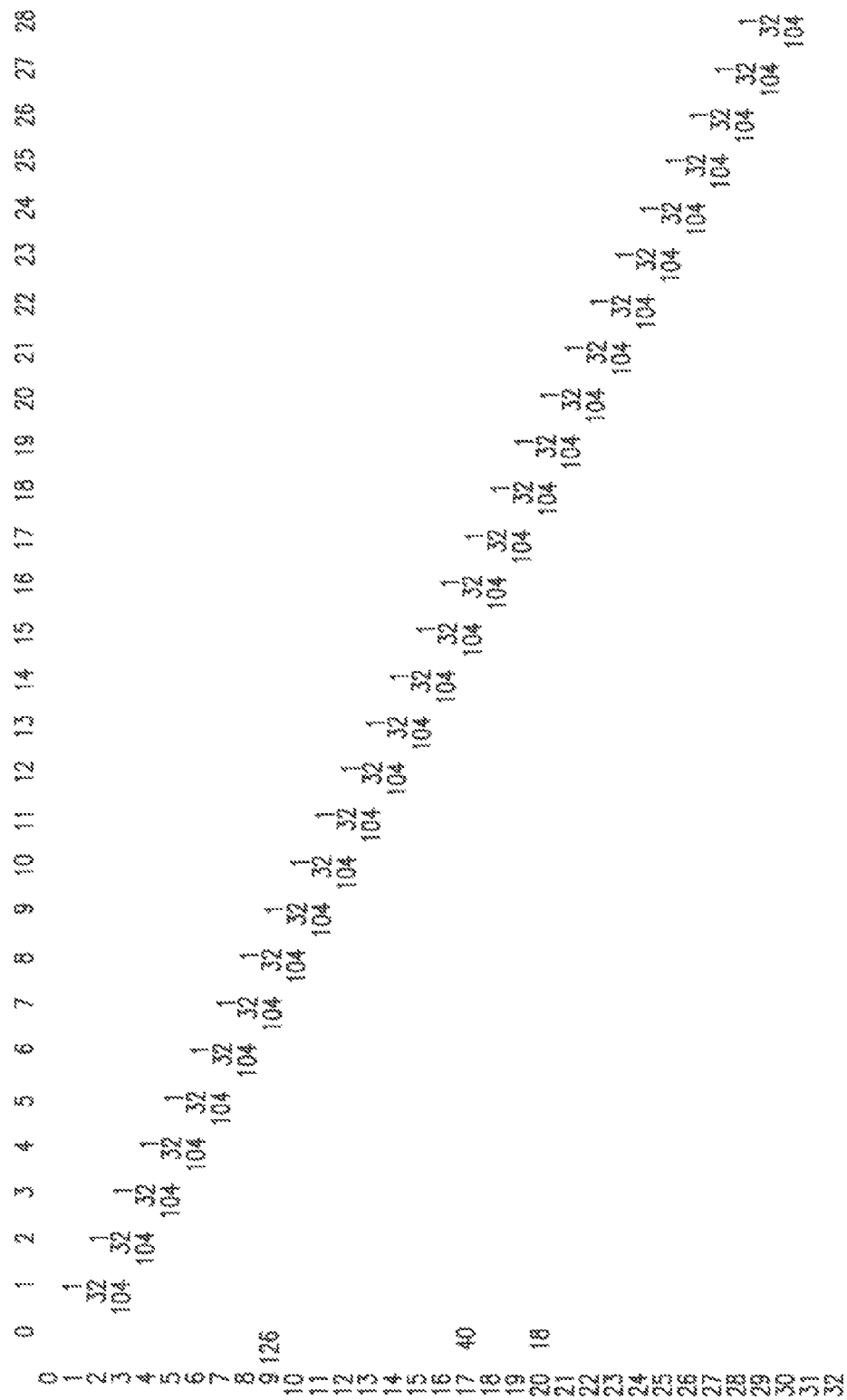
FIGS. 4A-4C are examples of a set of practical parity check matrices of the present invention.
Figures 1, 4B:
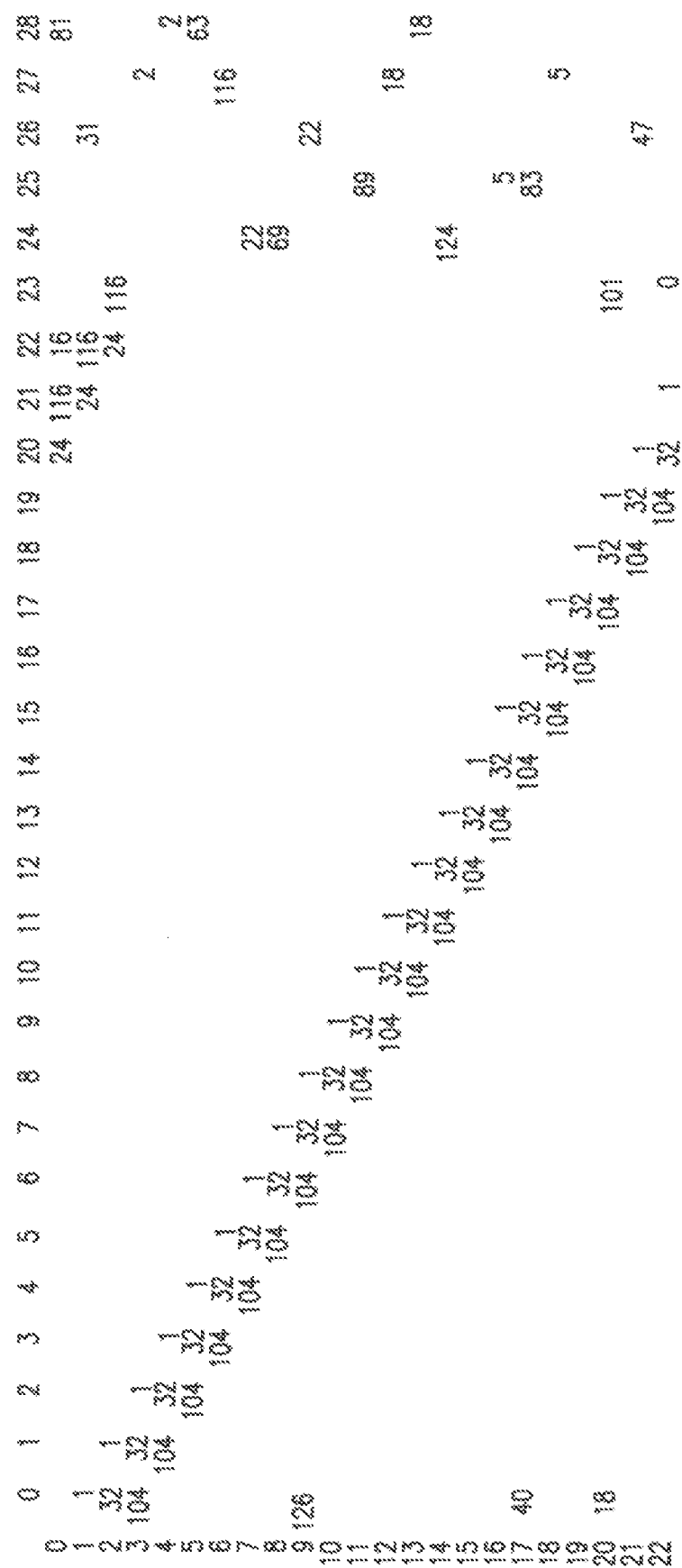
Figures 1, 4C:
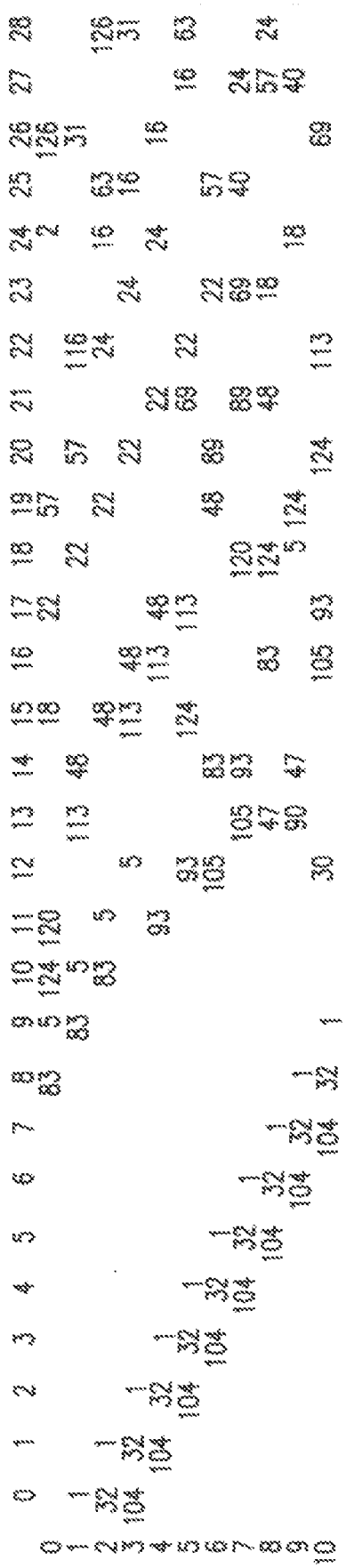

In an exemplified TDS-OFDM system as shown in FIGS. 4A-4C, the parity check matrix of the LDPC codes can be represented by a block matrix of "1"s and "0"s. Three different parity check matrices are used in the example, which is one matrix for each rate of communication (rates 0.4, 0.6, 0.8). The parity check matrix can be represented in short by a block matrix. The number of block columns for each of the parity check matrix is 59. The number of block rows for each parity check matrix differs with the rate of the code. For the rate 0.4 code the number of block rows is 35, for the rate 0.6 code the number of block rows is 23, and for the rate 0.8 code the number of block rows is 11. The position of "1"s and 0's differs for each block matrix and is as defined by the example. The actual parity check matrix used in the system can be obtained by replacing each one in the block matrix with a circularly shifted identity matrix I and each zero in the block matrix with a square matrix of all zero's. The size of this square matrix is 127(M). The structure of these 3 codes is given in FIGS. 4A-4C.

Decoding of LDPC codes typically involves an iterative algorithm based on the belief propagation model. The decoding algorithm for LDPC codes is based on passing messages between variable nodes and check nodes along the edges of the graph in an iterative manner. The messages represent estimates of the coded bits (LLR) based on the received signal from the channel and parity check constraints. Two different updates are to be performed during each iteration, namely column update (variable node update) and row update (check node update).

A model is constructed such that $L_{ch}$ represent the LLR value received from the channel; V (i,j,k) represent the LLR message along the $k^{th}$ edge of the $j^{th}$ variable node in $i^{th}$ block column after a variable node update. For example, as shown in FIG. 2A, the squared unit 202 has index given by i=3, j=1, and k=1, and the circled unit 204 has index given by i=3, j=2, and k=2. C(i,j,k) represent the LLR message along the $k^{th}$ edge of the $j^{th}$ check node in $i^{th}$ block row after a check node update. The number of "I"s in a block column is represented by λ(i) and the number of "I"s in a block row is represented by ρ(i). The λ's, and ρ's for various parity check matrix are as defined in the example. Transformation x defines a block row number of the check node connected to an edge from the variable node. Transformation y defines a sub-position of the check node inside the block row. Transformation z defines the actual edge of the check node to which it is connected. Similarly, transformation X defines the block column number of the variable node to which an edge from the check node is connected. Transformation Y defines a sub-position of the variable node inside a block column. Transformation Z defines the actual edge of the bit node to which it is connected. For example, in FIG. 2A x (3,1,1)=1,
y (3,1,1)=3,
z (3,1,1)=2.
With the inverse as follows:
X (1,3,2)=3,
Y (1,3,2)=1
Z (1,3,2)=1

There are various LDPC decoding methods that can be used for decoding LDPC codes. SPA (Sum Product Algorithm) and Min-sum algorithm are the commonly used methods. While the variable node update remains the same for all LDPC decoding methods, the check node update varies. In the preferred embodiment of the present invention, the Min-sum method is used. However, if using SPA instead, it would change the apparatus for check node update while all the other blocks would remain the same. The variable node/column update is given by:

$$V(i, j, k) = Lch(i, j) + \sum_{l=1/k}^{\lambda(i)} C(x(l, i, j), y(l, i, j), z(l, i, j)) \qquad (eq. 1)$$

where "/k" means that the value along the $k^{th}$ edge is excluded.

The check node/row update is given by, $$C'(i, j, k)) = \min(\text{magnitude } (V(X(l, i, j), Y(l, i, j), Z(l, i, j)))l \qquad (eq. 2)$$

-continued $$= 0 \text{ to } \rho(i)/k \text{ magnitude } (C(i, j, k))$$

$$= \text{corrected} (C'(i, j, k)) \text{ sign } (C(i, j, k))$$

$$= \prod_{l=1}^{l=\rho(i)/k} V(X(l, i, j), Y(l, i, j), Z(l, i, j))$$

The decoding algorithm can be summarized by the following pseudo-code:
For q=0 to maximum number of iterations for the design (Qmax)
  (Bit-Node Update)

For $i = 1$ to number of block columns $(n)$
  For $j = 1$ to $M$ (size of each block column)
  For $k = 1$ to $\lambda(i)$ $$V(i, j, k, q) = Lch(i, j) + \sum_{l=1/k}^{\lambda(i)} C(x(l, i, j), y(l, i, j), z(l, i, j), q-1)$$

(Check-Node Update)

For $i = 1$ to number of block rows$(k)$
  For $j = 1$ to $M$ (size of each block row)
  For $k = 1$ to $\rho(i)$ $$C'(i, j, k) = \min(\text{magnitude } (V(X(l, i, j), Y(l, i, j), Z(l, i, j)))l$$
$$= 0 \text{ to } \rho(i)/k \text{ magnitude}(C(i, j, k))$$
$$= \text{corrected } (C'(i, j, k)) \text{ sign } (C(i, j, k))$$
$$= \prod_{l=1}^{l=\rho(i)/k} V(X(l, i, j), Y(l, i, j), Z(l, i, j))$$

The soft decision on each bit is given by, $$V(i, j, q) = Lch(i, j) + \sum_{l=1}^{\lambda(i)} C(x(l, i, j), y(l, i, j), z(l, i, j), q-1)$$

The hard decision is given by, $$H(i,j,q)=0 \text{ if } V(i,j,q)>=0 \text{ else } H(i,j,q)=1.$$

Once the hard decisions are made for each bit, one checks if all the parity check constraints are satisfied. If the result is true then no more iterations are needed, otherwise one proceeds for the next iteration and continue the iteration process until the predetermined maximum number of iterations allowed for the decoder is reached.

In hardware implementation, the logic and memory for executing the above pseudo-code is provided. The architecture of the logic and memory usage determines the area, power consumption, and throughput for the decoder. The present invention provides an improved architecture in the logic and the memory such that an improved throughput, power consumption and memory area is achieved. The present invention further provides for multi-rated decoding. The values of various parameters are used as a trade off in order to obtain a hardware implementation that suits the requirements of the system.

As can be seen, in the example the same decoder has to handle any one of the three different codes, but the requirements of each component are limited by the maximum requirement among all three different codes. For example, each code has different numbers of block rows, Rate 0.4 code has a maximum of 35 block rows and hence 35 row update units are required. As another example the total number of non-zero entries or "1"s is different for each parity check matrix. Hence the memory requirement for the decoder would be dependent on the parity check matrix with maximum number of "1"s.

The following are the specifics of the hardware implementation. The hardware implementation may be used in similar implantations in any LDPC code other than the examples listed herein that has a parity check matrix structure similar to the one used in this example. The present invention does not need the parity check matrix to be constructed from sub blocks of square matrices with Identity shift. The square sub blocks can contain any random pattern of "1" such of these as output for the magnitude of $\rho(i)$ edges. Similarly, logic to find the sign of each edge separately is not needed. One can find the product of all the signs for the node and exclude the edge k by multiplying the total product with the sign of the $k^{th}$ edge.

$$\text{sign}(C(i, j, k)) = \prod_{l=1}^{l=\rho(i)/k} V(X(l, i, j), Y(l, i, j), Z(l, i, j))$$

can be written as $$Z = \prod_{l=1}^{l=\rho(i)} V(X(l, i, j), Y(l, i, j), Z(l, i, j))$$

$$\text{sign } (C(i, j, k)) = Z * \text{sign } (V(X(k, i, j), Y(k, i, j), Z(k, i, j))$$

Also each C'(i,j,k) undergoes correction as mentioned in U.S. patent application Ser. No. 11/550,394 to Haiyun Yang which is hereby incorporated herein by reference.

As can been seen in FIGS. 4A-4C, since rate 0.8 code has 8 block rows that have 27 "1"s in each row and 3 block rows that have 26 "1"s, one only needs to have 8 row/check-node update units that can handle 27 simultaneous inputs and 3 row-update units that can handle 26 simultaneous inputs. For rate 0.6 code that has 23 block rows with 13 "1"s and 3 block rows with 12 "1"s in each row, since one already have 11 row update units that can handle more than 13 simultaneous inputs, we need 9 more row-update units that can handle 13 simultaneous inputs and 3 row-update units that can handle 12 simultaneous inputs. For rate 0.4 code that has 30 block rows with 8 "1"s and 5 block rows with 7 "1"s, since we already have 23 row-update units that can handle more than 8 simultaneous inputs, one needs 7 block row units that can handle 8 simultaneous inputs and 5 more row-update units that handle 7 simultaneous inputs.

As can be seen from above, we have 8 row-update units that can handle 27 inputs, 3 row-update units that can handle 26 inputs, 9 row-update units that can handle 13 inputs, 3 row-update units that can handle 12 inputs, 7 row-update units that can handle 8 inputs and 5 row-update units that can handle 7 inputs. The row-update units are time shared M (127) times for each iteration to compute the row-update for each row in a block row.

Column-update units: The column update unit takes the $\lambda(i)$ inputs for the block column and the Lch input from the channel and computes V(i,j,k) according to equ. (1). Equ. (1) is split into 2 parts in order to minimize the logic needed to find the sum for each of the λ(i) edges. In other words, the sum for each edge is not computed separately. Thus, the split is as follows:

$$V' = Lch(i, j) + \sum_{l=1/k}^{\lambda(i)} C(x(l, i, j), y(l, i, j), z(l, i, j))$$

$$V(i, j, k) = V' - C(x(k, i, j), y(k, i, j), z(k, i, j))$$

We also need 2's complement circuits to convert the C messages, which are in sign-magnitude form to 2's complement form. Also the output V messages are in 2's complement form have to be converted to sign-magnitude form for the row-update unit.

Since rate 0.6 code has 5 block columns with 16 "1"s, 5 variable-node/column-update units that can handle 17 simultaneous inputs are required. Rate 0.4 and rate 0.8 codes have 10 block columns with 11 "1"s. Therefore, the previous 5 column-update units can be used, and merely 5 column update units that can handle 12 simultaneous inputs are additionally required.

For rate 0.6 code with the 9 block columns with 7 "1"s, since we don't have block columns with 11 "1"s these units can handle 5 of the block columns with 7 "1"s and we need merely an additional 4 column-update units that can handle 8 inputs. Rate 0.8 code has 37 block columns with 4 "1"s. Since no block columns with 7 "1"s in this code exits, we can use the 4 column-update units that can handle 8 inputs and 33 more column-update units that can handle 5 inputs are required.

Therefore, merely an additional 12 column-update units that can handle 4 inputs for the block column with 3 "1"s are required. The column-update units are time shared M (127) times for each iteration to compute the column-update for each column in a block column.

Memory: the C and V messages are time shared and stored in the memory. In other words, each memory unit either stores a C type message or a V type messages depending on the time considered. The total memory requirement is given by the total number of "1"s in the parity check matrix which would be the total number of "Is" in the block matrix T=t*127.

To facilitate simultaneous wire/read of values from and to the row update and column update units the memory should have a width t*(number of bits used to represent C/V) message. Since such a wide memory is not realizable for an ASIC implementation the memory should be broken down into blocks each of smaller width that can be realized in an ASIC implementation.

There can be several ways in which the wide memory can be broken down into smaller blocks, in the preferred embodiment, each "I" in the block matrix is associated with a cyclic shift. The big memory is broken into smaller memory blocks with each memory block storing the C/V values for the "Is" that have the same shift value. The width of the memory block for a shift value is the number of shifts of that value and the depth is equal to 127. If a shift value is not present, then there would be no memory for that shift value. This memory arrangement allows read and write of "t" simultaneous values from and to the memory that is realized as a dual port RAM.

The read C/V values are routed to the correct row/check update units for a give rate code using multiplexers. Similarly the output of row/column update units are routed to the correct memory locations using multiplexers.

Figure 5A:
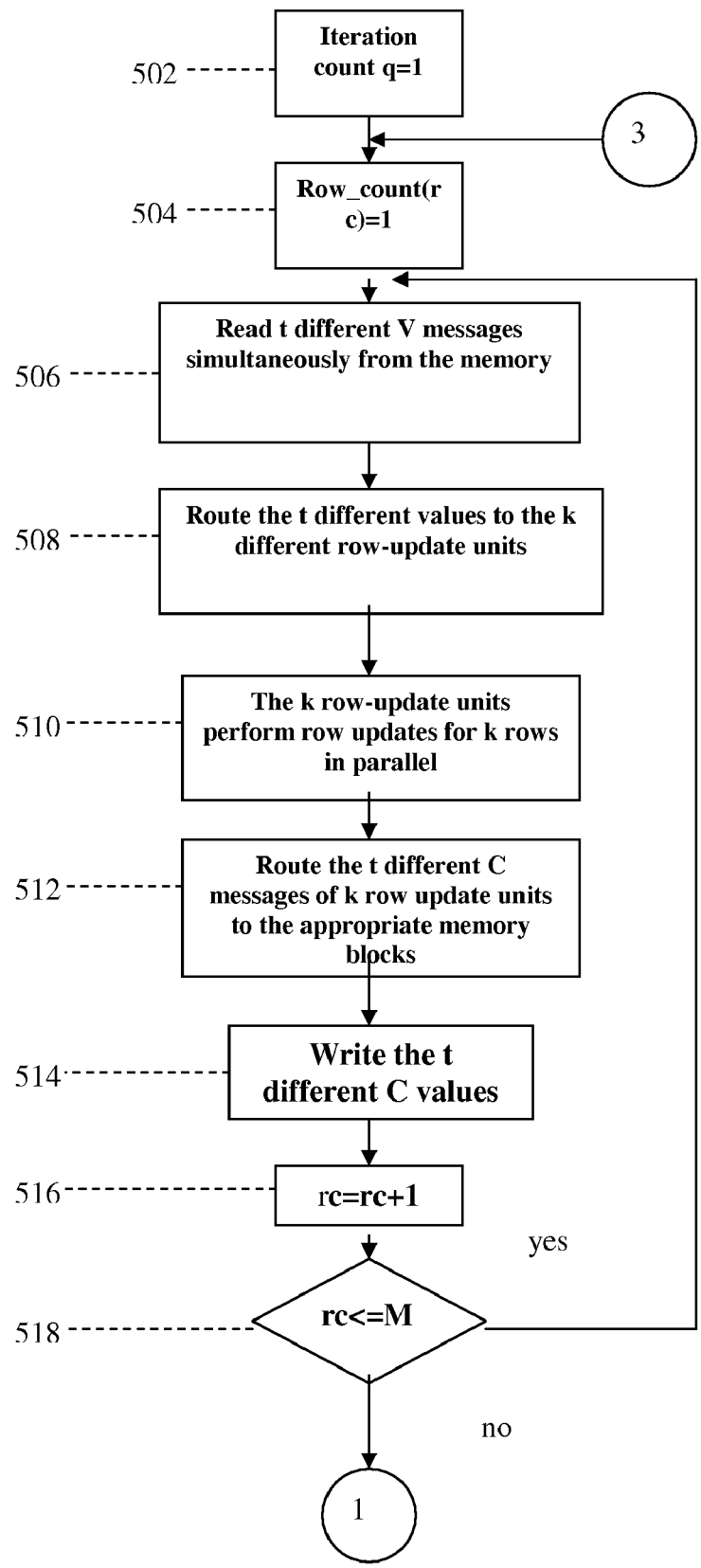
FIGS. 5A-5C are an examples of a flowchart in accordance with some embodiments of the invention.
Figure 5B:
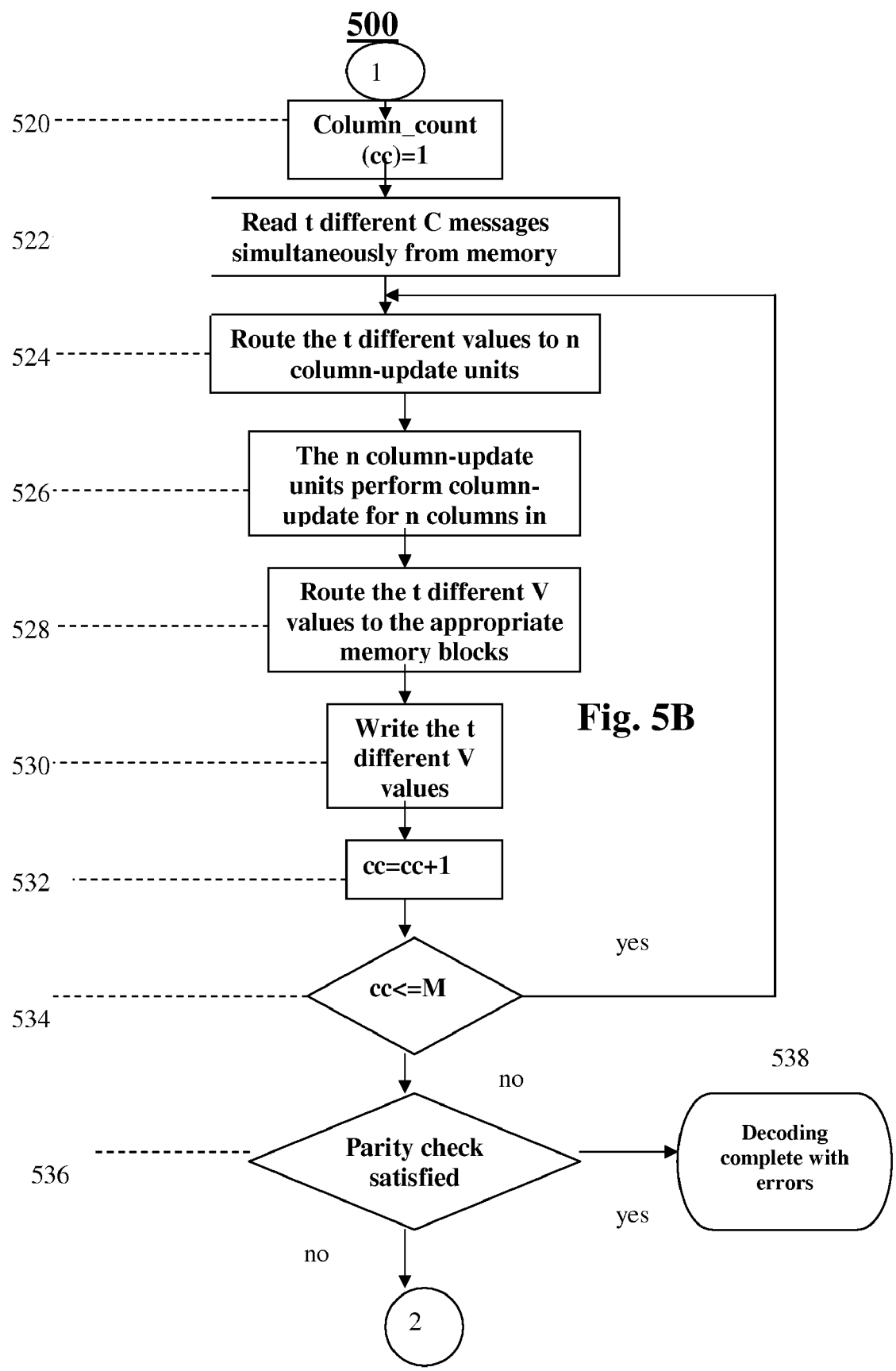
Figure 5C:
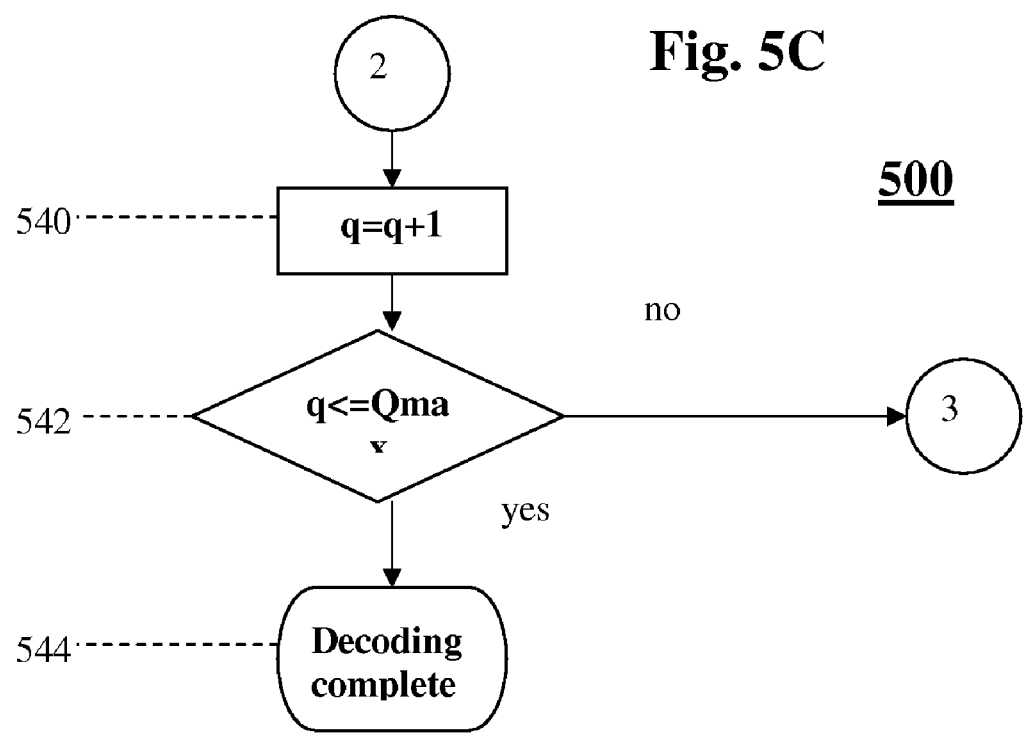

Referring to FIGS. 5A-5C, flow chart 500 summarizes a process of the present invention. Start iteration by setting q=1 (Step 502). Start row count rc=1 (Step 504). Read 't' different V messages simultaneously from the memory (Step 506). Route the 't' different values to 'k' row update units (Step 508). The 'k' row update units perform row updates for k rows in parallel (Step 510). Route that each row and column has only a single "1". Further, a decoder associated therewith does not need square sub-blocks to have circular shifts, can have any random pattern with a single '1' in each row and column.

In the exemplified architecture, 35 row update/check-node update units and 59 column update/variable-node update units are used. Each row update unit is a parallel update unit, i.e. it can take (ρ(i)) V . . . messages simultaneously and produces (ρ(i)) C . . . messages simultaneously. Similarly each column update unit is a parallel update unit, i.e. it can take (λ(i)) C . . . messages and Lch simultaneously and produces (λ(i)) V . . . messages simultaneously. 59 hard decision units and a parity, satisfying check unit that can handle 59 simultaneous inputs are provided.

Referring to FIG. 4, a block diagram 400 is shown. A set of memory blocks 402 is shown. A row multiplex 404 is coupled to memory blocks 402 retrieving data for row updates 1-n. A column multiplex 406 is coupled to memory blocks 402 retrieving data for column updates 1-m.

Row-update units: The row update unit implements equ. (2). For efficient hardware implementation, equ. (2) can be rewritten as the following:

$$C'(i, j, k) = \min(\text{magnitude}(V(X(l, i, j), Y(l, i, j), Z(l, i, j)))l$$
$$= 0 \text{ to } \rho(i)/k$$
$$= \min(\text{magnitude}(V(X(l, i, j), Y(l, i, j), Z(l, i, j)))l$$
$$= 0 \text{ to } \rho(i) ifk$$
$$\neq \min \text{edge}$$

$$\text{else} = \min1(\text{magnitude}(V(X(l, i, j), Y(l, i, j), Z(l, i, j)))l$$
$$= 0 \text{ to } \rho(i) ifk$$
$$= \min \text{edge}$$

Since the minimum among ρ(i) inputs excluding itself can either be the minimum among the ρ(i) inputs, or it can be the next minimum if the excluded edge is the minimum edge among the ρ(i) inputs; hardware logic for all ρ(i) edges in the row-update units is not needed. One can find min and min₁ and can use one the 't' different C values from 'k' row update units to the appropriate memory block (Step 512). Write the t different C values to memory (Step 514). Row counter (rc) add one (Step 516). A determination is made herein as to whether the row counter value is less than M, the number of rows in each block row (Step 518). If still less than M, revert to Step 504, otherwise set column count (cc) to 1 (Step 520). Read 't' different C messages simultaneously from memory (Step 522). Route the t different values to 'n' column-update units (Step 524). 'n' column-update units perform column updates on 'n' columns in parallel (Step 526). Route the 't' different V values to the appropriate memory blocks (Step 528). Write the 't' different V values to memory (Step 530). Add to column count (cc) by 1 (Step 532). A determination is made herein as to whether the column counter value is less than M, the number of columns in each block column (Step 534). If value is less than M, revert back to Step 520, otherwise add '1' to counter q (Step 536). A further determination is made herein as to whether the parity check is satisfied (Step 538). If satisfied, decoding process is over as we have decoded to a codeword (Step 540). A still further determination is made herein as to whether the maximum number of iteration is reached (Step 542). If the maximum number of iteration Q is not reached, revert back to Step 504. Otherwise, the decoding process is over without correcting all the errors and the resulting output is not a codeword (Step 544).

As can be appreciated, the number of row update units is k (block rows) and the number of column update units is n (block columns). Memory size is proportional to the number of identity matrices I (t). The decoder structure is independent of the size of square matrix M, and the decoding time is proportional to the size of the square matrix (M). Further, the decoding time independent of block rows and block columns. The decoder does not need square sub-blocks to have circular shifts, and can have any random pattern with a single '1' in each row and column. The same decoder is used for decoding multi-rate codes.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "example," and terms of similar meaning should not be construed as limiting the item described to a given time period or to an item available as of a given time, but instead should be read to encompass conventional, traditional, normal, or example technologies that may be available now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

What is claimed is:

1. In a decoder for decoding a low density parity check (LDPC) code suitable for decoding multi-rated LDPC codes, a method comprising the steps of:

providing a memory for the decoding with the memory dependent on a parity check matrix H with a predetermined maximum number of "1"s;

using a number of column updating units, updating columns parallely and simultaneously producing messages; and using a number of row updating units, updating rows parallely and simultaneously to produce messages;

wherein decoding time is proportional to the size of the square matrix M;

whereby an improved architecture in a logic and the memory is provided such that an improved throughput, power consumption, and memory area are achieved.

2. The method of claim 1, wherein the number of row update units is k (block rows).

3. The method of claim 1, wherein the number of column update units is n (block columns).

4. The method of claim 1, wherein the Memory size is proportional to the number of identity matrices I(t).

5. The method of claim 1, wherein the decoder structure is independent of the size of a square matrix M.

6. The method of claim 1, wherein decoding time is independent of block rows and block columns.

7. The method of claim 1, wherein a decoder does not need square sub-blocks to have circular shifts, and can have any random pattern with a single '1' in each row and column.

8. The method of claim 1, wherein a same decoder is used for decoding multi-rate codes.

9. A low density parity check (LDPC) decoder suitable for decoding multi-rated LDPC codes, the decoder comprising:

a memory for the decoding with the memory dependent on a parity check matrix H with maximum number of "1"s;

a number of row updating units, coupled to the memory, for updating rows parallely and simultaneously producing messages; and a number of row updating units, coupled to the memory, for updating rows parallely and simultaneously producing messages;

wherein decoding time is proportional to the size of the square matrix M;

whereby an improved architecture in a logic and the memory is provided such that an improved throughput, power consumption, and memory area is achieved.

10. The decoder of claim 9, wherein the number of row update units is k (block rows).

11. The decoder of claim 9, wherein the number of column update units is n (block columns).

12. The decoder of claim 9, wherein the Memory size proportional to the number of identity matrices I(t).

13. The decoder of claim 9, wherein the decoder structure independent of the size of a square matrix M.

14. The decoder of claim 9, wherein decoding time is independent of block rows and block columns.

15. The decoder of claim 9, wherein a decoder does not need square sub-blocks to have circular shifts, can have any random pattern with a single '1' in each row and column.

16. The decoder of claim 9, wherein a same decoder is used for decoding multi-rate codes.

* * * * *